(12) United States Patent
Mamoto et al.

(10) Patent No.: US 9,504,178 B2
(45) Date of Patent: Nov. 22, 2016

(54) VEHICLE CONTROL DEVICE FOR ELECTRIC ROLLING STOCK

(71) Applicant: Mitsubishi Electric Corporation, Chiyoda-ku, Tokyo (JP)

(72) Inventors: Yasuaki Mamoto, Tokyo (JP); Yoshiji Arai, Tokyo (JP)

(73) Assignee: MITSUBISHI ELECTRIC CORPORATION, Chiyoda-Ku, Tokyo (JP)

( * ) Notice: Subject to any disclaimer, the term of this patent is extended or adjusted under 35 U.S.C. 154(b) by 0 days.

(21) Appl. No.: 14/763,289

(22) PCT Filed: Apr. 18, 2013

(86) PCT No.: PCT/JP2013/061447
§ 371 (c)(1),
(2) Date: Jul. 24, 2015

(87) PCT Pub. No.: WO2014/170980
PCT Pub. Date: Oct. 23, 2014

(65) Prior Publication Data
US 2015/0351274 A1    Dec. 3, 2015

(51) Int. Cl.
*H05K 5/02* (2006.01)
*H05K 5/06* (2006.01)
(Continued)

(52) U.S. Cl.
CPC ........... *H05K 5/069* (2013.01); *B60R 16/0239* (2013.01); *B61C 17/00* (2013.01); *H05K 5/0204* (2013.01); *H05K 5/0217* (2013.01)

(58) Field of Classification Search
CPC .......... H05K 5/06; H05K 5/02; H05K 5/069; H05K 5/0217; H05K 5/0204; H05K 7/1432; H05K 7/18; B61C 17/00; B60R 16/0239; H02B 1/48; H02K 11/00; H02K 5/22; Y10S 248/906
See application file for complete search history.

(56) References Cited

U.S. PATENT DOCUMENTS

2009/0065248 A1* 3/2009 Finley ................ H02K 5/22
174/541

FOREIGN PATENT DOCUMENTS

JP   54-9814    1/1979
JP   54-23413   2/1979
(Continued)

OTHER PUBLICATIONS

Office Action (Notification of Reasons for Rejection) issued on Dec. 8, 2015, by the Japanese Patent Office in corresponding Japanese Patent Application No. 2015-512241 and an English Translation of the Office Action. (6 pages).
(Continued)

*Primary Examiner* — Mark Le
(74) *Attorney, Agent, or Firm* — Buchanan Ingersoll & Rooney PC

(57) ABSTRACT

A draining member protrudes from both openings of a through-hole in a vehicle control device. It has a pair of spaced elastic members extending from a connection. The connection has a width smaller than a width of the through-hole. The width between the elastic members varies from the connection toward their ends, reaching a narrow portion smaller than the width of the through-hole via an increased width portion greater than the width of the through-hole. A leg portion beyond the narrow portion has a width greater than the width of the through-hole. A minimum distance between a location where the width between the increased width portion and the narrow portion matches the width of the through-hole, and another location where the width of the leg portion is equal to or greater than the width of the through-hole, is equal to or greater than a thickness of the housing.

6 Claims, 5 Drawing Sheets

(51) Int. Cl.
  *B60R 16/023*   (2006.01)
  *B61C 17/00*   (2006.01)

(56) References Cited

FOREIGN PATENT DOCUMENTS

| JP | 56-98713 | 8/1981 |
|---|---|---|
| JP | 58-71255 A | 4/1983 |
| JP | 2000-258513 A | 9/2000 |
| JP | 2001-95129 A | 4/2001 |
| JP | 2002-120720 A | 4/2002 |
| JP | 2006-168534 A | 6/2006 |
| JP | 2007-17357 A | 1/2007 |
| JP | 2011-238676 A | 11/2011 |
| JP | 2012-116211 A | 6/2012 |
| JP | 2013-65789 A | 4/2013 |

OTHER PUBLICATIONS

*International Search Report (PCT/ISA/210) mailed on Jul. 16, 2013, by the Japanese Patent Office as the International Searching Authority for International Application No. PCT/JP2013/061447.
*Written Opinion (PCT/ISA/237) mailed on Jul. 16, 2013, by the Japanese Patent Office as the International Searching Authority for International Application No. PCT/JP2013/061447.

* cited by examiner

VEHICLE CONTROL DEVICE FOR ELECTRIC ROLLING STOCK

TECHNICAL FIELD

The present disclosure relates to a vehicle control device for electric rolling stock provided with a draining member.

BACKGROUND ART

A control device provided under the floor of a railway vehicle needs to be airtight in order to prevent infiltration of dust and rainwater from the outside.

The vehicle control device disclosed in Patent Literature 1 is housed inside a vehicle control equipment casing having an opening in the ceiling, and the opening of the vehicle control equipment casing is connected to an opening in the bottom surface of a sealed room provided on the undersurface of the vehicle's framework. The railway vehicle control device disclosed in Patent Literature 2 includes inside the device a mechanism having a heat-radiating function while preventing infiltration of rainwater, and has a structure such that the mechanism containing a dividing protrusion (watertight weir) provided in the opening for preventing infiltration of rainwater does not protrude to the outside.

CITATION LIST

Patent Literature

Patent Literature 1: Unexamined Japanese Patent Application Kokai Publication No. 2006-168534.
Patent Literature 2: Unexamined Japanese Patent Application Kokai Publication No. 2012-116211.

SUMMARY OF INVENTION

Technical Problem

When water enters the inside of the housing of the control device due to deterioration of the packing and/or the like, for example, draining of the inside of the housing of the control device becomes necessary. With the art disclosed in Patent Literature 1 and Patent Literature 2, it is impossible to accomplish draining of the inside of the housing of the control device while the vehicle is moving, for example.

In consideration of the foregoing, it is an objective of the present disclosure to improve draining efficiency.

Solution to Problem

In order to accomplish the above objective, the vehicle control device for electric rolling stock according to the present disclosure mounted on electric rolling stock and for controlling the electric rolling stock includes a housing with a through-hole formed in the bottom surface; and a draining member that is inserted into the through-hole and is held in a state protruding from both openings of the through-hole.

Advantageous Effects of Invention

With the present disclosure, it is possible to improve draining efficiency.

DESCRIPTION OF EMBODIMENTS

Figure 1:
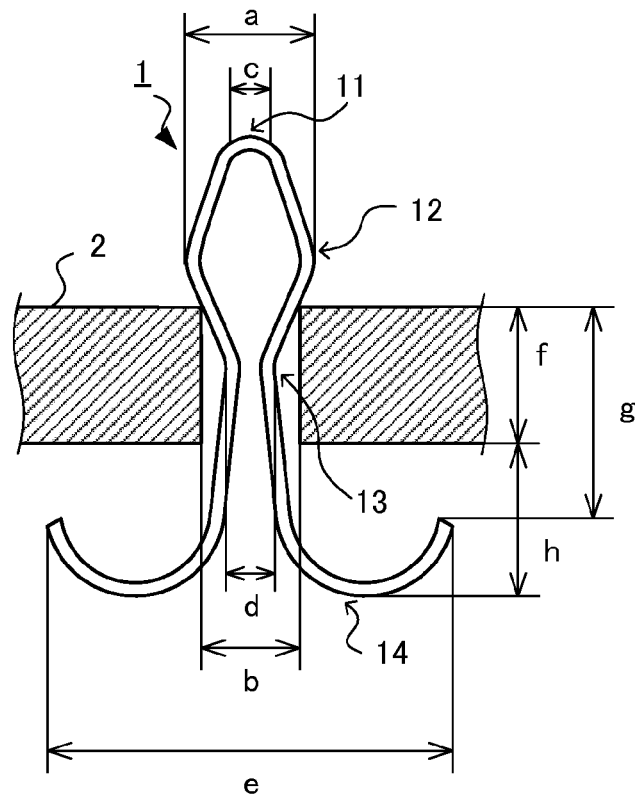
FIG. 1 is a cross-sectional view of a vehicle control device for electric rolling stock provided with a draining member according to an embodiment of the present disclosure.

Below, embodiments of the present disclosure are described in detail with reference to the drawings. In the drawings, portions that are the same or equivalent are labeled with the same reference symbols.

Figure 2:
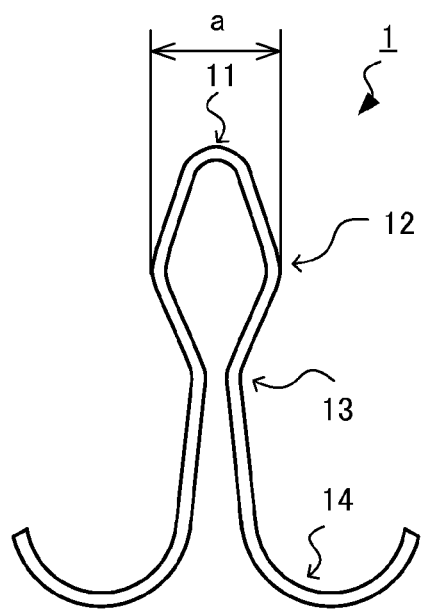
FIG. 2 is a frontal view of the draining member according to the embodiment.
Figure 3:
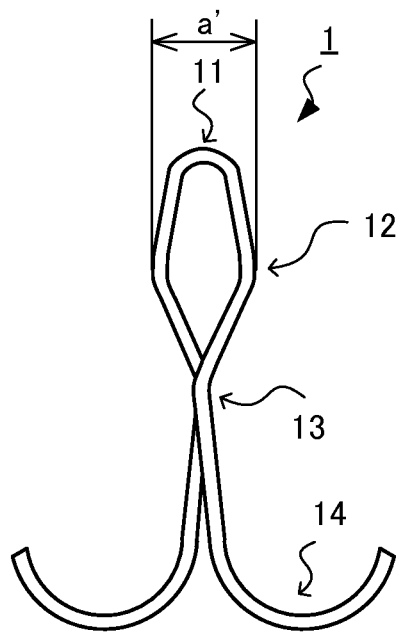
FIG. 3 is a frontal view of the draining member according to the embodiment in a state in which pressure is applied in a direction closing an increased width portion.
Figure 4:
FIG. 4 is a side view of the draining member according to the embodiment.

FIG. 1 is a cross-sectional view of a vehicle control device for electric rolling stock provided with a draining member according to an embodiment of the present disclosure. The draining member 1 is inserted from the outside of a housing, for example, into a through-hole formed in a vehicle control device 2 for electric rolling stock (hereafter referred to simply as the vehicle control device), and is held in a state protruding from both openings of the through-hole. In FIG. 1, the top side is the inside of the housing of the vehicle control device 2 and the bottom side is the outside of the housing of the vehicle control device 2. The vehicle control device 2 is mounted on electric rolling stock and controls the electric rolling stock. FIG. 2 is a frontal view of the draining member according to the embodiment. FIG. 3 is a frontal view of the draining member according to the embodiment in a state in which pressure is applied in a direction closing an increased width portion. FIG. 4 is a side view of the draining member according to the embodiment.

The draining member 1 is formed of a pair of elastic members extending separately from a connecting location, mutually connected (hereafter referred to as the connecting location) 11 and facing each other across a space. The draining member 1 may be formed by bending an elastic member such as a single stainless steel wire and/or the like, or may be formed by connecting one end of a pair of elastic members through welding and/or the like. The material of which the draining member 1 is formed is not limited to stainless steel, and may be metal such as aluminum, copper, iron and/or the like, or may be resin.

In a state in which no force other than gravity is applied to the draining member 1, a width c of the connecting location 11 is smaller than a width b of the through-hole, and the width between the pair of elastic members facing each other is varied from the connecting location 11 toward the ends of the elastic members, reaching a narrow portion 13 smaller than the width b of the through-hole after passing an increased width portion 12 greater than the width b of the through-hole. That is to say, the width a of the increased width portion 12 is greater than the width b of the through-hole, and the width d of the narrow portion 13 is smaller than the width b of the through-hole. A leg portion 14 at a distance from the narrow portion 13 of the pair of elastic members facing each other has a maximum width e greater than the width b of the through-hole. The draining member 1 is made of elastic members, and consequently deforms as illustrated in FIG. 3 when pressure is applied in a direction closing the increased width portion 12. In the examples illustrated in FIGS. 2 and 3, the leg portion 14 of each elastic member is each bent in a direction separating from the center of the width of the pair of elastic members facing each other.

As illustrated in FIG. 3, when pressure of at least a threshold value is applied in a direction closing the increased width portion 12 of the draining member 1, the width of the increased width portion 12 becomes a', where a' is less than the width b of the through-hole. That is to say, when pressure of at least a threshold value is applied in a direction closing the increased width portion 12 of the draining member 1, the width a' of the increased width portion 12 is smaller than the width b of the through-hole, so it is possible to insert the draining member 1 into the through-hole from the outside of the housing of the vehicle control device 2. When pressure is no longer applied in the direction for closing the increased width portion 12 with the draining member 1 in a state protruding from both openings of the through-hole, the draining member 1 is held in a state protruding from both openings of the through-hole, as illustrated in FIG. 1.

In this embodiment, the draining member 1 being held does not indicate that the draining member 1 is in a state in which the draining member 1 strictly does not move, but rather means that the draining member 1 does not fall out of the through-hole due to vibrations and/or the like generated while the vehicle is moving, for example. By simply forming through-holes in the housing of the vehicle control device 2, there are cases in which water does not drain due to the water's surface tension, but by the draining member 1 being held in a state protruding from both openings of the through-hole, it is possible to more efficiently drain the inside of the housing of the vehicle control device 2.

In the draining member 1, the minimum distance between a first location at which the width of the pair of elastic members facing each other between the increased width portion 12 and the narrow portion 13 matches the width of the through-hole, and a second location at which the width of the pair of elastic members of the leg portion 14 facing each other is equal to or greater than the width of the through-hole, is at least a threshold value that is greater than the thickness of the housing of the vehicle control device 2. In the example in FIG. 1, a distance g between the location where the width of the pair of elastic members facing each other between the increased width portion 12 and the narrow portion 13 matches the width b of the through-hole and the location where the width of the pair of elastic members facing each other is a maximum in the leg portion 14 is the above-described minimum distance. By making the above-described minimum distance g is equal to or greater than a threshold value greater than a thickness f of the housing of the vehicle control device 2, it is possible for draining of the inside of the housing of the vehicle control device 2 to be accomplished more efficiently because the draining member 1 vibrates in the direction of insertion into the housing of the vehicle control device 2 due to vibrations generated while the vehicle is moving, for example. The threshold value can be freely-determined in the light of draining efficiency.

Figure 5:
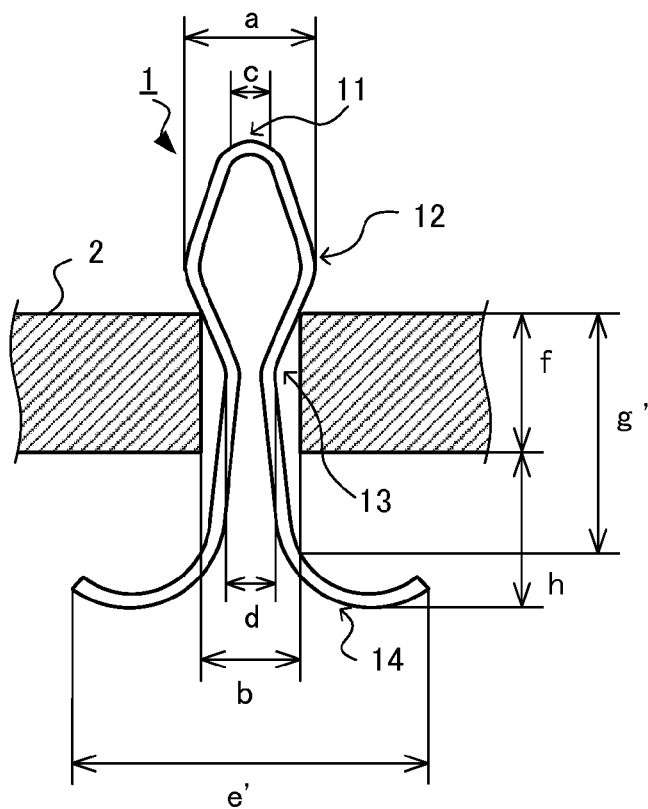
FIG. 5 is a cross-sectional view of the vehicle control device for electric rolling stock provided with the draining member according to the embodiment.

FIG. 5 is a cross-sectional view of the vehicle control device for electric rolling stock provided with the draining member according to the embodiment. In the draining member 1 illustrated in FIG. 5, the shape of the leg portion 14 differs from that of the draining member 1 illustrated in FIG. 1. In the example in FIG. 5, a distance g' between a location where the width of the pair of elastic members facing each other between the increased width portion 12 and the narrow portion 13 matches the width b of the through-hole and a location where the width of the pair of elastic members facing each other in the leg portion 14 matches the width b of the through-hole is the above-described minimum distance. By making the above-described minimum distance g' is equal to or greater than a threshold value greater than the thickness f of the housing of the vehicle control device 2, similarly to the above-described case, it is possible for draining of the inside of the housing of the vehicle control device 2 to be accomplished more efficiently.

Figure 6:
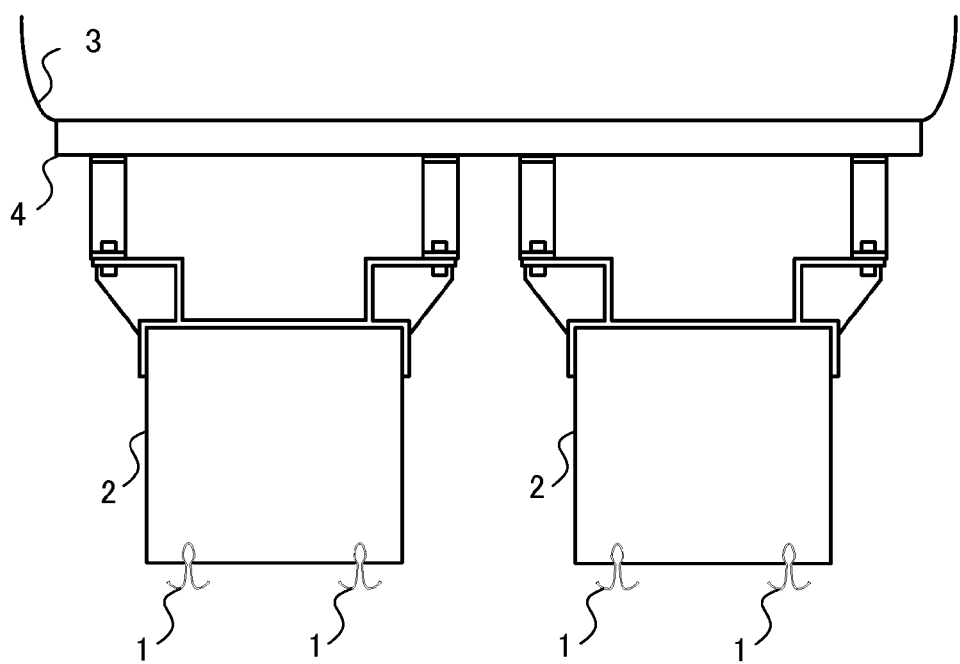
FIG. 6 is a cross-sectional view along the railroad tie direction of a vehicle provided with the vehicle control device for electric rolling stock according to the embodiment.

FIG. 6 is a cross-sectional view along the railroad tie direction of a vehicle provided with the control device for electric rolling stock according to the embodiment. Through-holes are formed in the bottom surface of the vehicle control device 2, and each of the draining members 1 is inserted into each of the through-holes and held in place. The vehicle control device 2 is attached to the bottom side of a framework 4 of a vehicle 3. The size of the vehicle control device 2, the number of through-holes, the surface where the through-holes are formed and the method of attachment to the vehicle 3 are arbitrary and not limited to the example illustrated in FIG. 6.

Figure 7:
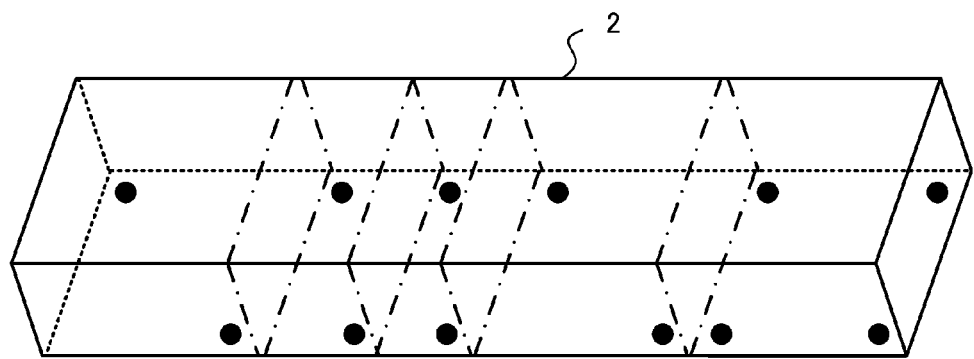
FIG. 7 is an oblique view of the vehicle control device for electric rolling stock according to the embodiment.

FIG. 7 is an oblique view of the vehicle control device for electric rolling stock according to the embodiment. Dashed-dotted lines indicate compartments inside the vehicle control device 2. As indicated by black dots in FIG. 7, at least one through-hole is formed in each compartmentalized space in the bottom surface of the vehicle control device 2. The position and number of through-holes can be freely-determined in accordance with the area of the compartmentalized bottom surface and the necessity of airtightness of the vehicle control device 2. For example, it would be fine to form through-holes in four corners or two corners of the bottom surface. When through-holes are formed in four corners or two corners, it is possible to drain water more efficiently in accordance with the gradient of the railway track of the vehicle. In addition, it would be fine to make an incline in the bottom surface of the vehicle control device 2 and to form through-holes in a location on the bottom side of the incline. The shape of the through-holes is arbitrary, and is determined in the light of draining efficiency and the airtightness of the vehicle control device 2. For example, through-holes 4 mm in diameter may be formed in the four corners of the bottom surface of the vehicle control device 2.

Figure 8:
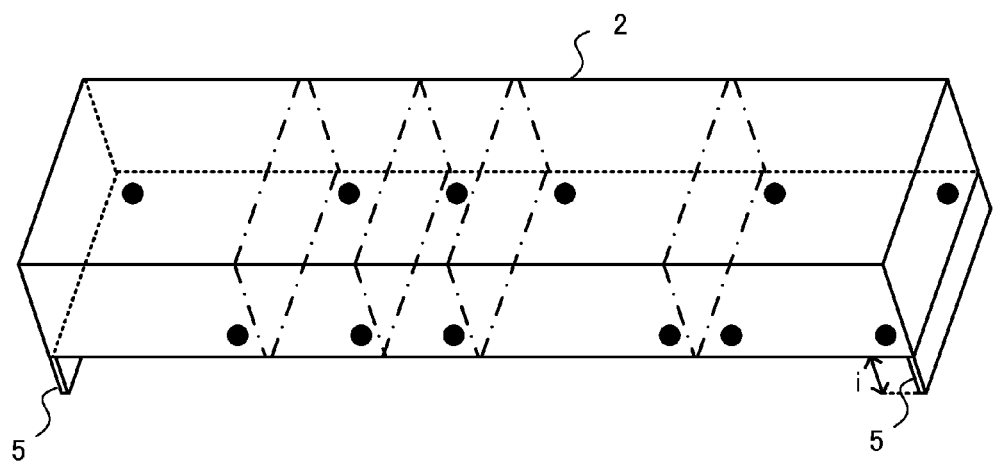
FIG. 8 is an oblique view of the vehicle control device for electric rolling stock according to the embodiment.

FIG. 8 is an oblique view of the vehicle control device for electric rolling stock according to the embodiment. Dashed-dotted lines indicate compartments inside the vehicle control device 2, and black dots indicate through-holes. In the housing of the vehicle control device 2, a frame 5 is connected to the outside of the housing surface where the through-holes are formed. Of the draining members 1 inserted into and held in the through-holes in the vehicle control device 2 illustrated in FIG. 8, the length in the insertion direction of the draining member, of a portion of the draining member 1 that protrudes outside of the housing of the vehicle control device 2 is shorter than the length of the frame 5 in the insertion direction. That is to say, of the draining members 1 illustrated in FIG. 1, the length h in the insertion direction of the portion protruding to the outside of the housing of the vehicle control device 2 is shorter than the length i in the insertion direction of the frame 5 illustrated in FIG. 8. Consequently, even if the vehicle control device 2 is placed on the ground, the draining members 1 do not penetrate any further into the inside of the housing of the vehicle control device 2. The shape of the frame 5 is arbitrary and is not limited to the example of FIG. 8.

Figure 9:
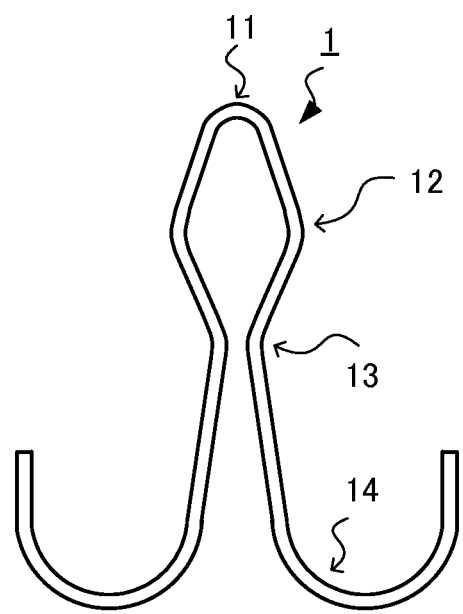
FIG. 9 is a frontal view illustrating a different example of the draining member according to the embodiment.

FIG. 9 is a frontal view illustrating a different example of a draining member according to the embodiment. The leg portion 14 of each elastic member illustrated in FIG. 9 is bent in a U-shape in a direction separating from the center of the width where the pair of elastic members face each other. By bending this portion into a U-shape, it is possible to prevent injuries to fingers when inserting the draining member 1 into a through-hole by applying a force is equal to or greater than a threshold value in the direction for closing the increased width portion 12 for example by pinching the leg portion 14.

Figure 10:
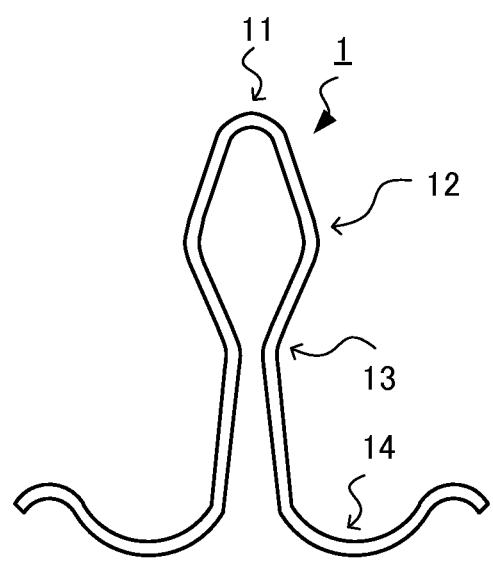
FIG. 10 is a frontal view illustrating a different example of the draining member according to the embodiment.

FIG. 10 is a frontal view illustrating a different example of a draining member according to the embodiment. A portion of the leg portion 14 of each elastic member illustrated in FIG. 10 is bent into an arc shape, and a center of the arc shape is located farther from the housing than the bent portion of the arc shape. In the leg portion 14, the points in which the width of the pair of elastic members facing each other is equal to or greater than the width of the through-hole, and distance from portions in which the width of the pair of elastic members facing each other between the increased width portion 12 and the narrow portion 13 matches the width of the through-hole is a minimum are positioned at the location bent into the above-described arc shape. As illustrated in FIG. 10, because a portion of the draining member 1 that contacts the housing of the vehicle control device 2 when the draining member 1 vibrates in the insertion direction is bent into an arc shape, it is possible to prevent damage to the housing of the vehicle control device 2.

For example, when a cotter pin is used as the draining member, in order for the cotter pin to be inserted into and held in a through-hole formed in the housing, it is necessary for the leg parts of the cotter pin to be inserted first from inside the housing, causing the cotter pin to protrude from both openings of the through-hole, and for the leg parts of the cotter pin to be bent in different directions from the outside of the housing. In addition, the work of bending the leg parts of the cotter pin is painstaking work using pliers and requires time. In contrast, the draining member 1 according to the embodiment may be inserted into the inside of the housing from the outside of the housing by applying a force of at least a threshold value in the direction for closing the increased width portion 12, so that it is possible to shorten work time when doing the insertion. In addition, the work of putting in and taking out the draining member 1 according to the embodiment is accomplished from outside of the housing, so it is possible to prevent the draining member 1 from entering the inside of the housing or the draining member 1 being left behind inside the housing when removal work is done.

The shape of the draining member 1 is not limited to the shapes disclosed in FIG. 2, FIG. 9 and FIG. 10. The shape of the draining member 1 needs not have left-right symmetry. The thickness of the elastic members may be freely-determined in the light of draining efficiency based on the surface area of the through-holes.

As explained above, with the vehicle control device 2 provided with the draining member 1 according to the embodiment of the present disclosure, it is possible to improve draining efficiency.

The foregoing describes some example embodiments for explanatory purposes. Although the foregoing discussion has presented specific embodiments, persons skilled in the art will recognize that changes may be made in form and detail without departing from the broader spirit and scope of the invention. Accordingly, the specification and drawings are to be regarded in an illustrative rather than a restrictive sense. This detailed description, therefore, is not to be taken in a limiting sense, and the scope of the invention is defined only by the included claims, along with the full range of equivalents to which such claims are entitled.

INDUSTRIAL APPLICABILITY

The present disclosure is suitably utilized in an apparatus provided with a draining member and through-holes for draining.

REFERENCE SIGNS LIST

1 Draining member
2 Vehicle control device for electric rolling stock
3 Vehicle
4 Framework
5 Frame
11 Connecting location
12 Increased width portion
13 Narrow portion
14 Leg portion

The invention claimed is:

1. A vehicle control device for electric rolling stock, the vehicle control device comprising:
   a housing with a through-hole formed in a bottom surface thereof; and
   a draining member that is inserted into the through-hole and is held in a state protruding from both openings of the through-hole, wherein:
   the draining member is formed of a pair of elastic members extending separately from a connecting location, mutually connected, and facing face each other across a space,
   the connecting location has a width smaller than a width of the through-hole,
   a width between the pair of elastic members facing each other is varied from the connecting location toward ends of the elastic members,
   the draining member includes: a narrow portion having a width that is smaller than the width of the through-hole; an increased width portion having a width that is greater than the width of the through-hole; and a leg portion at a distance from the narrow portion and having a maximum width that is greater than the width of the through-hole;
   a minimum distance between a first location at which the width of the pair of elastic member facing each other between the increased width portion and the narrow portion matches the width of the through-hole, and a second location at which the width of the pair of elastic members of the leg portion facing each other is equal to or greater than the width of the through-hole, is equal to or greater than a threshold value that is greater than a thickness of the housing, and when a pressure equal to or greater than a threshold value is applied in a direction for closing the increased width portion, the width of the increased width portion becomes smaller than the width of the through-hole.

2. The vehicle control device for electric rolling stock according to claim 1, wherein the leg portion of each elastic member is bent in a direction separating from a center of the width where the pair of elastic members face each other.

3. The vehicle control device for electric rolling stock according to claim 1, wherein the leg portion of each elastic member is bent in into a U-shape in a direction separating from a center of the width where the pair of elastic members face each other.

4. The vehicle control device for electric rolling stock according to claim 1, wherein a portion of the leg portion of each elastic member is bent in an arc shape, and a center of the arc shape is located farther from the housing than the bent portion of the arc shape.

5. The vehicle control device for electric rolling stock according to claim 1, further comprising a frame connected to an outside of the bottom surface in which the through-hole is formed;
   wherein a length, in an insertion direction of the draining member, of a portion of the draining member that protrudes outside of the housing is shorter than a length of the frame in the insertion direction.

6. The vehicle control device for electric rolling stock according to claim 1, wherein:
   the housing includes compartments dividing a space inside; and
   at least one through-hole is formed in a bottom surface of each of the compartments.

\* \* \* \* \*